(12) United States Patent
Ye et al.

(10) Patent No.: US 12,125,669 B2
(45) Date of Patent: *Oct. 22, 2024

(54) THERMAL-AIDED INSPECTION BY ADVANCED CHARGE CONTROLLER MODULE IN A CHARGED PARTICLE SYSTEM

(71) Applicant: ASML Netherlands B.V., Veldhoven (NL)

(72) Inventors: Ning Ye, San Jose, CA (US); Jun Jiang, San Jose, CA (US); Jian Zhang, San Jose, CA (US); Yixiang Wang, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/362,757

(22) Filed: Jul. 31, 2023

(65) Prior Publication Data

US 2023/0395352 A1 Dec. 7, 2023

Related U.S. Application Data

(63) Continuation of application No. 17/553,357, filed on Dec. 16, 2021, now Pat. No. 11,728,131.
(Continued)

(51) Int. Cl.
*H01J 37/28* (2006.01)
*H01J 37/244* (2006.01)
*H01J 37/26* (2006.01)

(52) U.S. Cl.
CPC ............ *H01J 37/28* (2013.01); *H01J 37/244* (2013.01); *H01J 37/265* (2013.01); *H01J 2237/0047* (2013.01); *H01J 2237/2817* (2013.01)

(58) Field of Classification Search
CPC ........ H01J 37/00; H01J 37/244; H01J 37/265; H01J 37/263; H01J 37/226; H01J 37/26;
(Continued)

(56) References Cited

U.S. PATENT DOCUMENTS 5,358,806 A * 10/1994 Haraichi ............. H01J 37/3056
216/60
7,427,755 B2 9/2008 Ding et al.
(Continued)

FOREIGN PATENT DOCUMENTS

TW I669742 B 8/2019
TW I711818 B 12/2020

OTHER PUBLICATIONS

Office Action of the Intellectual Property Office of Taiwan issued in related Taiwanese Patent Application No. 110146877; mailed Jan. 5, 2023 (8 pgs.).

*Primary Examiner* — Jason L McCormack
(74) *Attorney, Agent, or Firm* — Finnegan, Henderson, Farabow, Garrett & Dunner, LLP

(57) ABSTRACT

Apparatuses, systems, and methods for providing beams for controlling charges on a sample surface of charged particle beam system. In some embodiments, a module comprising a laser source configured to emit a beam. The beam may illuminate an area adjacent to a pixel on a wafer to indirectly heat the pixel to mitigate a cause of a direct photon-induced effect at the pixel. An electron beam tool configured to detect a defect in the pixel, wherein the defect is induced by the indirect heating of the pixel.

20 Claims, 9 Drawing Sheets

Related U.S. Application Data

(60) Provisional application No. 63/126,430, filed on Dec. 16, 2020.

(58) Field of Classification Search
CPC .. H01J 37/28; H01J 37/07; H01J 37/22; H01J 37/222; H01J 37/228; H01J 2237/0047; H01J 2237/2817; H01J 2237/0048; H01J 2237/2065
USPC ................................ 250/293, 306, 307, 311
See application file for complete search history.

(56) References Cited

U.S. PATENT DOCUMENTS

| | | |
|---|---|---|
| 8,809,779 B2 | 8/2014 | Xiao et al. |
| 9,536,697 B2 | 1/2017 | Wang et al. |
| 11,728,131 B2 * | 8/2023 | Ye .......................... H01J 37/263 250/306 |
| 2008/0035854 A1 * | 2/2008 | Jin .......................... H01J 37/26 250/396 R |
| 2010/0155596 A1 * | 6/2010 | Xiao .................. G01N 23/2202 392/416 |
| 2011/0036981 A1 | 2/2011 | Zhao et al. |
| 2011/0248164 A1 * | 10/2011 | Straw .................... H01J 37/244 250/307 |
| 2015/0364291 A1 | 12/2015 | Ogawa et al. |
| 2016/0268120 A1 | 9/2016 | Bezel et al. |
| 2016/0336146 A1 | 11/2016 | Goldenshtein |
| 2017/0108444 A1 | 4/2017 | Otani et al. |
| 2018/0166247 A1 | 6/2018 | Moore et al. |
| 2020/0027693 A1 * | 1/2020 | Fang ..................... H01L 21/682 |
| 2021/0066029 A1 * | 3/2021 | Shouji ................... H01J 37/228 |

* cited by examiner

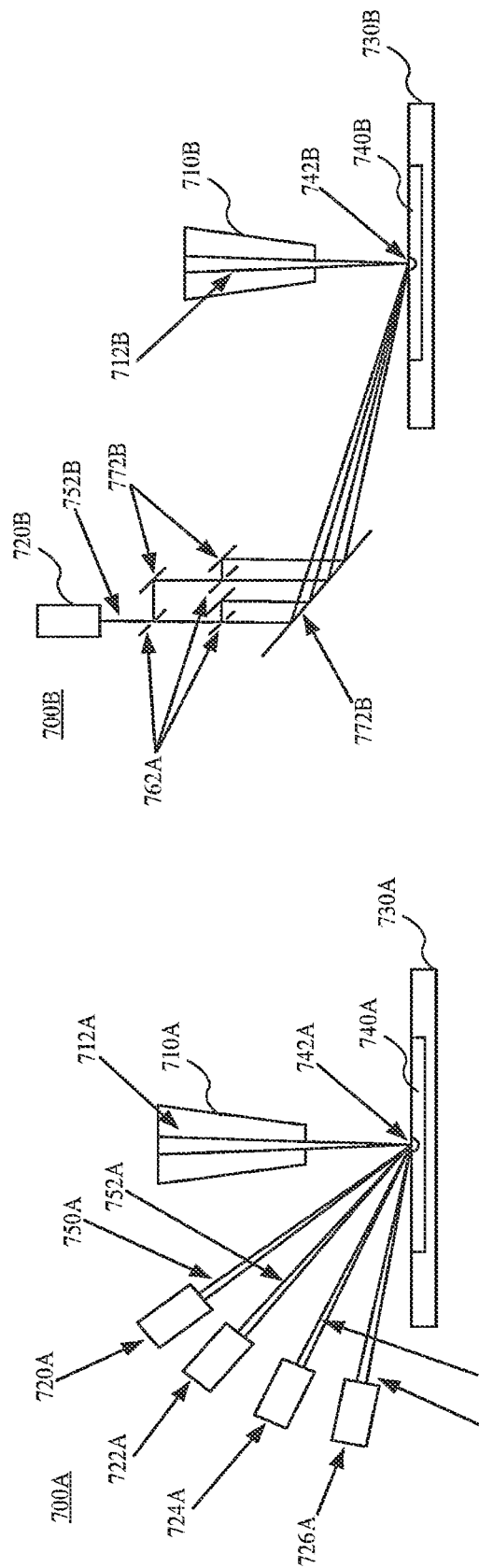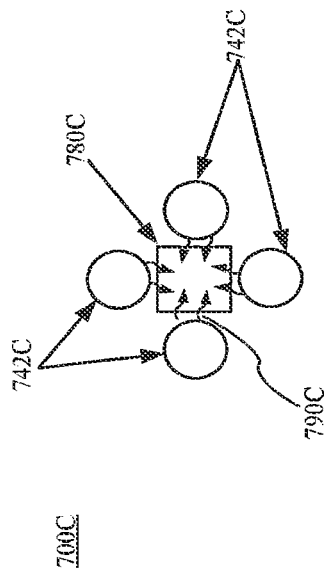

THERMAL-AIDED INSPECTION BY ADVANCED CHARGE CONTROLLER MODULE IN A CHARGED PARTICLE SYSTEM

CROSS-REFERENCE TO RELATED APPLICATIONS

This application is a continuation of U.S. application Ser. No. 17/553,357, filed on Dec. 16, 2021, which claims priority of U.S. application No. 63/126,430, filed on Dec. 16, 2020. The disclosures of the above-referenced applications are incorporated herein by reference in their entireties.

FIELD

The description herein relates to the field of charged particle beam systems, and more particularly to systems for providing beams for controlling charges on a sample surface of charged particle beam system inspection systems.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to sub-100 or even sub-10 nanometers, inspection systems capable of higher resolution than those utilizing optical microscopes are needed.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With a SEM, electrons of a single primary electron beam, or electrons of a plurality of primary electron beams, can be focused at locations of interest of a wafer under inspection. The primary electrons interact with the wafer and may be backscattered or may cause the wafer to emit secondary electrons. The intensity of the electron beams comprising the backscattered electrons and the secondary electrons may vary based on the properties of the internal and external structures of the wafer, and thereby may indicate whether the wafer has defects.

SUMMARY

Embodiments of the present disclosure provide apparatuses, systems, and methods for providing beams for controlling charges on a sample surface of charged particle beam system. In some embodiments, a module configured to emit a beam may illuminate an area adjacent to a pixel on a wafer to indirectly heat the pixel to mitigate a cause of a direct photon-induced effect at the pixel. An electron beam tool configured to detect a defect in the pixel, wherein the defect is induced by the indirect heating of the pixel.

In some embodiments, a method for inspection may include emitting, from a module, a beam that illuminates an area adjacent to a pixel on a wafer to indirectly heat the pixel to mitigate a cause of a direct photon-induced effect at the pixel and detecting a defect in the pixel, wherein the defect is induced by the indirect heating of the pixel.

In some embodiments, a non-transitory computer readable medium may store a set of instructions that is executable by at least one processor of a computing device to cause the computing device to perform a method for inspection. The method may include, from a module, a beam that illuminates an area adjacent to a pixel on a wafer to indirectly heat the pixel to mitigate a cause of a direct photon-induced effect at the pixel and detecting a defect in the pixel, wherein the defect is induced by the indirect heating of the pixel.

BRIEF DESCRIPTION OF THE DRAWINGS

FIG. 7A is a schematic diagram illustrating an exemplary electron beam system, consistent with embodiments of the present disclosure.

FIG. 7B is a schematic diagram illustrating an exemplary electron beam system, consistent with embodiments of the present disclosure.

FIG. 7C is a schematic diagram illustrating a top view of the exemplary electron beam systems of FIG. 7A or FIG. 7B, consistent with embodiments of the present disclosure.

DETAILED DESCRIPTION

Figure 1:
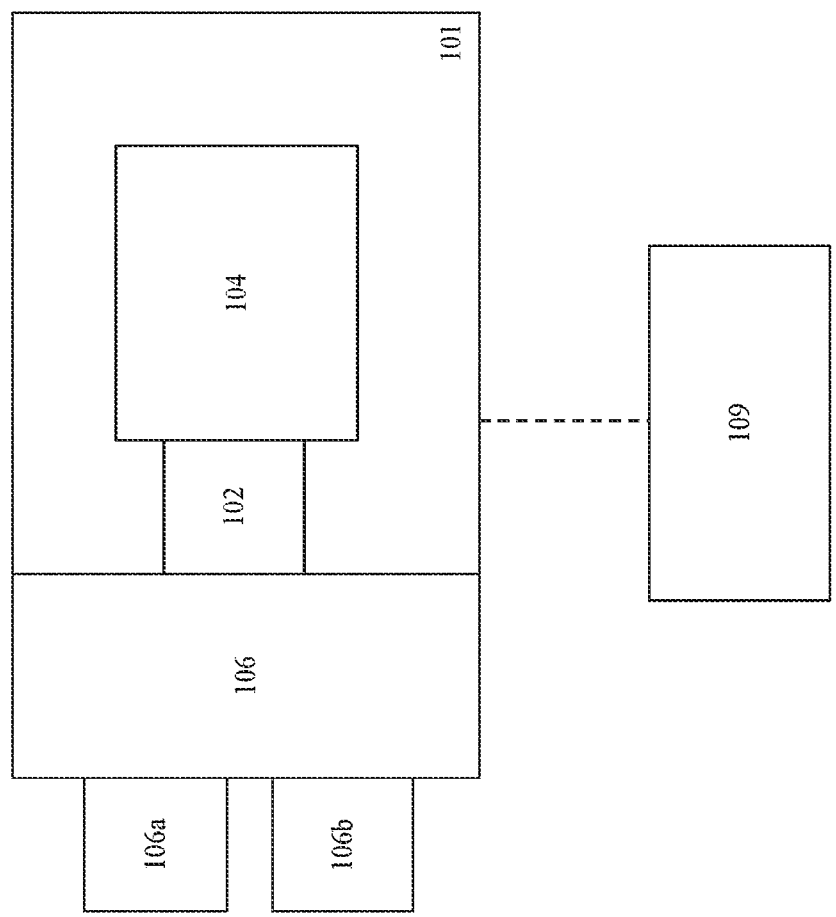
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims. For example, although some embodiments are described in the context of utilizing electron beams, the disclosure is not so limited. Other types of charged particle beams may be similarly applied. Furthermore, other imaging systems may be used, such as optical imaging, photodetection, x-ray detection, extreme ultraviolet inspection, deep ultraviolet inspection, or the like.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection may be carried out using a scanning electron microscope (SEM). A SEM can be used to image these extremely small structures, in effect, taking a "picture" of the structures of the wafer. The image can be used to determine if the structure was formed properly and also if it was formed at the proper location. If the structure is defective, then the process can be adjusted so the defect is less likely to recur. Defects may be generated during various stages of semiconductor processing. For the reason stated above, it is important to find defects accurately and efficiently as early as possible.

The working principle of a SEM is similar to a camera. A camera takes a picture by receiving and recording brightness and colors of light reflected or emitted from people or objects. A SEM takes a "picture" by receiving and recording energies or quantities of electrons reflected or emitted from the structures. Before taking such a "picture," an electron beam may be provided onto the structures, and when the electrons are reflected or emitted ("exiting") from the structures, a detector of the SEM may receive and record the energies or quantities of those electrons to generate an image. To take such a "picture," some SEMs use a single electron beam (referred to as a "single-beam SEM"), while some SEMs use multiple electron beams (referred to as a "multi-beam SEM") to take multiple "pictures" of the wafer. By using multiple electron beams, the SEM may provide more electron beams onto the structures for obtaining these multiple "pictures," resulting in more electrons exiting from the structures. Accordingly, the detector may receive more exiting electrons simultaneously, and generate images of the structures of the wafer with a higher efficiency and a faster speed.

When electron beams are provided to the structures, charges may be accumulated on the structures due to large beam current, which may affect the quality of the image. To regulate the accumulated charges on the structures, an ACC module may be employed to illuminate a light beam, such as a laser beam, on the structures, so as to control the accumulated charges due to effects such as photoconductivity, photoelectric, or thermal effects.

For example, semiconductor structures have outer shell atomic levels that exhibit an energy band structure, which includes a valence band, an energy gap, and a conduction band. When an external energy (e.g., in the form of a light beam) is applied to a semiconductor, the valence electrons may gain enough energy to break their bonding with a parent atom and jump from the valence band to the conduction band. The free electrons in a conduction band are able to move freely due to their detachment from parent atoms. When the electron jumps from the valence band to the conduction band, a hole is created in the valence band. Thus, in semiconductors, pairs of free electrons and holes are generated when electrons jump the energy gap.

A light beam applied to a semiconductor may be adjusted to adjust the number of free electrons (e.g., free electron density) generated in the semiconductor. The number of free electrons generated affects the current flow in a semiconductor. For example, as the number of free electrons generated increases in a semiconductor, the current flow in the semiconductor increases and the resistance in the semiconductor decreases. Therefore, a light beam emitted from an ACC module may be used to control the charge on a semiconductor structure (e.g., improve the conductivity in a PN junction).

ACC modules, however, suffer from constraints. Although ACC modules may be employed to control accumulated charges on a sample during inspection, these ACC modules do not necessarily simulate operating conditions of the sample. For example, many failures in ICs are caused by high temperatures in PN junctions. Although ACC modules have some heating effects on a sample, these heating effects are indistinguishable from light-induced effects using voltage contrast when an ACC module is used to directly emit a beam to heat a pixel during inspection.

Moreover, heating the sample stage is not suitable for in-situ heating during inspection since stage heating may cause issues with machine metrology (e.g., the stage may drift with changes in temperature) or inspection signals for detecting precise locations on the sample (e.g., heating the stage may affect other components of the system such as lenses, detectors, etc.).

Some of the disclosed embodiments provide systems and methods that address some or all of these disadvantages by using one or more ACC modules to emit light beams to areas adjacent to pixels. The disclosed embodiments provide one or more ACC modules that may heat a pixel by emitting light beams to areas adjacent to the pixel, thereby allowing detection of light-induced defects and heat-induced defects using voltage contrast.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

FIG. 1 illustrates an exemplary electron beam inspection (EBI) system 100 consistent with embodiments of the present disclosure. EBI system 100 may be used for imaging. As shown in FIG. 1, EBI system 100 includes a main chamber 101, a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system.

A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be a part of the structure.

In some embodiments, controller 109 may include one or more processors (not shown). A processor may be a generic or specific electronic device capable of manipulating or processing information. For example, the processor may include any combination of any number of a central processing unit (or "CPU"), a graphics processing unit (or "GPU"), an optical processor, a programmable logic controllers, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), and any type circuit capable of data processing. The processor may also be a virtual processor that includes one or more processors distributed across multiple machines or devices coupled via a network.

In some embodiments, controller 109 may further include one or more memories (not shown). A memory may be a generic or specific electronic device capable of storing codes and data accessible by the processor (e.g., via a bus). For example, the memory may include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or any type of storage device. The codes may include an operating system (OS) and one or more application programs (or "apps") for specific tasks. The memory may also be a virtual memory that includes one or more memories distributed across multiple machines or devices coupled via a network.

Figure 2:
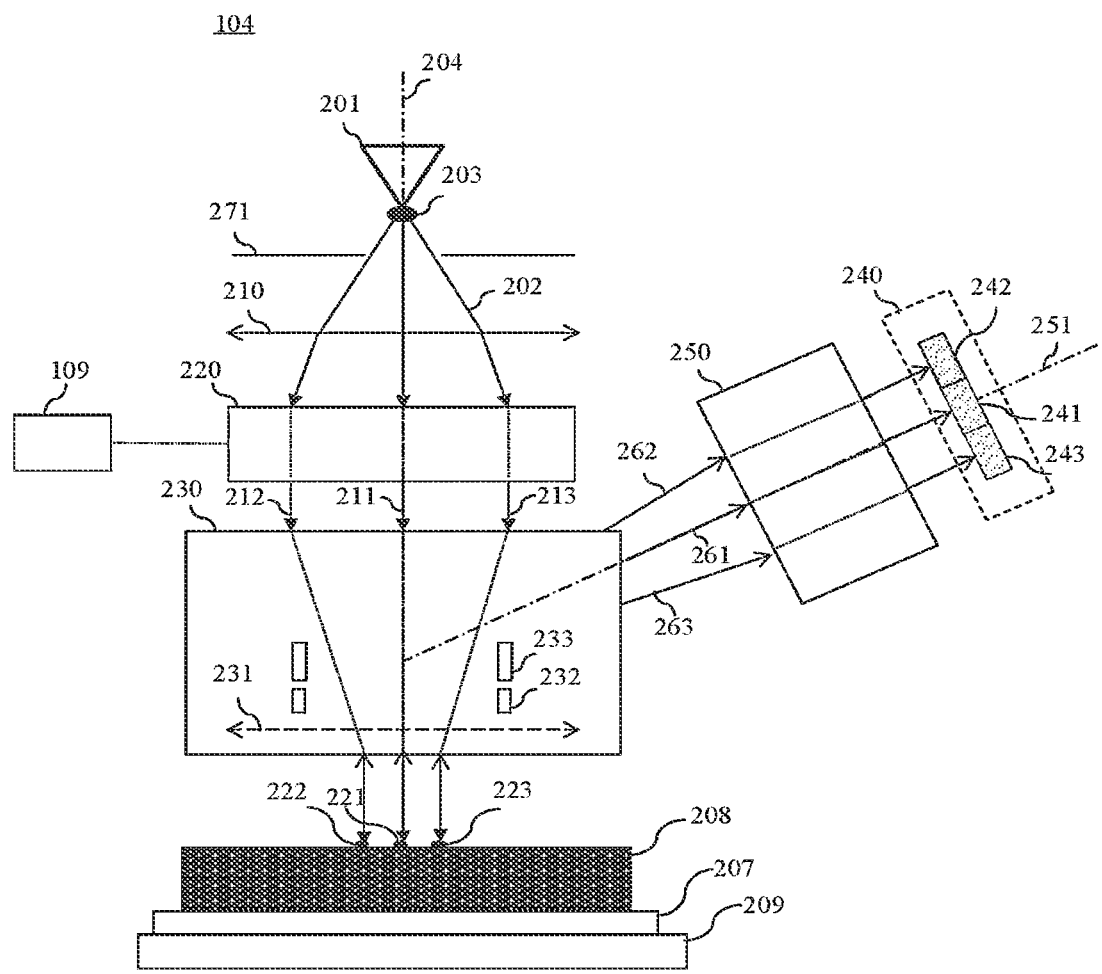
FIG. 2 is a schematic diagram illustrating an exemplary multi-beam system that is part of the exemplary charged particle beam inspection system of FIG. 1, consistent with embodiments of the present disclosure.

Reference is now made to FIG. 2, which is a schematic diagram illustrating an exemplary electron beam tool 104 including a multi-beam inspection tool that is part of the EBI system 100 of FIG. 1, consistent with embodiments of the present disclosure. In some embodiments, electron beam tool 104 may be operated as a single-beam inspection tool that is part of EBI system 100 of FIG. 1. Multi-beam electron beam tool 104 (also referred to herein as apparatus 104) comprises an electron source 201, a Coulomb aperture plate (or "gun aperture plate") 271, a condenser lens 210, a source conversion unit 220, a primary projection system 230, a motorized stage 209, and a sample holder 207 supported by motorized stage 209 to hold a sample 208 (e.g., a wafer or a photomask) to be inspected. Multi-beam electron beam tool 104 may further comprise a secondary projection system 250 and an electron detection device 240. Primary projection system 230 may comprise an objective lens 231. Electron detection device 240 may comprise a plurality of detection elements 241, 242, and 243. A beam separator 233 and a deflection scanning unit 232 may be positioned inside primary projection system 230.

Electron source 201, Coulomb aperture plate 271, condenser lens 210, source conversion unit 220, beam separator 233, deflection scanning unit 232, and primary projection system 230 may be aligned with a primary optical axis 204 of apparatus 104. Secondary projection system 250 and electron detection device 240 may be aligned with a secondary optical axis 251 of apparatus 104.

Electron source 201 may comprise a cathode (not shown) and an extractor or anode (not shown), in which, during operation, electron source 201 is configured to emit primary electrons from the cathode and the primary electrons are extracted or accelerated by the extractor and/or the anode to form a primary electron beam 202 that form a primary beam crossover (virtual or real) 203. Primary electron beam 202 may be visualized as being emitted from primary beam crossover 203.

Source conversion unit 220 may comprise an image-forming element array (not shown), an aberration compensator array (not shown), a beam-limit aperture array (not shown), and a pre-bending micro-deflector array (not shown). In some embodiments, the pre-bending micro-deflector array deflects a plurality of primary beamlets 211, 212, 213 of primary electron beam 202 to normally enter the beam-limit aperture array, the image-forming element array, and an aberration compensator array. In some embodiments, apparatus 104 may be operated as a single-beam system such that a single primary beamlet is generated. In some embodiments, condenser lens 210 is designed to focus primary electron beam 202 to become a parallel beam and be normally incident onto source conversion unit 220. The image-forming element array may comprise a plurality of micro-deflectors or micro-lenses to influence the plurality of primary beamlets 211, 212, 213 of primary electron beam 202 and to form a plurality of parallel images (virtual or real) of primary beam crossover 203, one for each of the primary beamlets 211, 212, and 213. In some embodiments, the aberration compensator array may comprise a field curvature compensator array (not shown) and an astigmatism compensator array (not shown). The field curvature compensator array may comprise a plurality of micro-lenses to compensate field curvature aberrations of the primary beamlets 211, 212, and 213. The astigmatism compensator array may comprise a plurality of micro-stigmators to compensate astigmatism aberrations of the primary beamlets 211, 212, and 213. The beam-limit aperture array may be configured to limit diameters of individual primary beamlets 211, 212, and 213. FIG. 2 shows three primary beamlets 211, 212, and 213 as an example, and it is appreciated that source conversion unit 220 may be configured to form any number of primary beamlets. Controller 109 may be connected to various parts of EBI system 100 of FIG. 1, such as source conversion unit 220, electron detection device 240, primary projection system 230, or motorized stage 209. In some embodiments, as explained in further details below, controller 109 may perform various image and signal processing functions. Controller 109 may also generate various control signals to govern operations of the charged particle beam inspection system.

Condenser lens 210 is configured to focus primary electron beam 202. Condenser lens 210 may further be configured to adjust electric currents of primary beamlets 211, 212, and 213 downstream of source conversion unit 220 by varying the focusing power of condenser lens 210. Alternatively, the electric currents may be changed by altering the radial sizes of beam-limit apertures within the beam-limit aperture array corresponding to the individual primary beamlets. The electric currents may be changed by both altering the radial sizes of beam-limit apertures and the focusing power of condenser lens 210. Condenser lens 210 may be an adjustable condenser lens that may be configured so that the position of its first principle plane is movable. The adjustable condenser lens may be configured to be magnetic, which may result in off-axis beamlets 212 and 213 illuminating source conversion unit 220 with rotation angles. The rotation angles change with the focusing power or the position of the first principal plane of the adjustable condenser lens. Condenser lens 210 may be an anti-rotation condenser lens that may be configured to keep the rotation angles unchanged while the focusing power of condenser lens 210 is changed. In some embodiments, condenser lens 210 may be an adjustable anti-rotation condenser lens, in which the rotation angles do not change when its focusing power and the position of its first principal plane are varied.

Objective lens 231 may be configured to focus beamlets 211, 212, and 213 onto a sample 208 for inspection and may form, in the current embodiments, three probe spots 221, 222, and 223 on the surface of sample 208. Coulomb aperture plate 271, in operation, is configured to block off peripheral electrons of primary electron beam 202 to reduce Coulomb effect. The Coulomb effect may enlarge the size of each of probe spots 221, 222, and 223 of primary beamlets 211, 212, 213, and therefore deteriorate inspection resolution.

Beam separator 233 may, for example, be a Wien filter comprising an electrostatic deflector generating an electrostatic dipole field and a magnetic dipole field (not shown in FIG. 2). In operation, beam separator 233 may be configured to exert an electrostatic force by electrostatic dipole field on individual electrons of primary beamlets 211, 212, and 213. The electrostatic force is equal in magnitude but opposite in direction to the magnetic force exerted by magnetic dipole field of beam separator 233 on the individual electrons. Primary beamlets 211, 212, and 213 may therefore pass at least substantially straight through beam separator 233 with at least substantially zero deflection angles.

Deflection scanning unit 232, in operation, is configured to deflect primary beamlets 211, 212, and 213 to scan probe spots 221, 222, and 223 across individual scanning areas in a section of the surface of sample 208. In response to incidence of primary beamlets 211, 212, and 213 or probe spots 221, 222, and 223 on sample 208, electrons emerge from sample 208 and generate three secondary electron beams 261, 262, and 263. Each of secondary electron beams 261, 262, and 263 typically comprise secondary electrons (having electron energy ≤50 eV) and backscattered electrons (having electron energy between 50 eV and the landing energy of primary beamlets 211, 212, and 213). Beam separator 233 is configured to deflect secondary electron beams 261, 262, and 263 towards secondary projection system 250. Secondary projection system 250 subsequently focuses secondary electron beams 261, 262, and 263 onto detection elements 241, 242, and 243 of electron detection device 240. Detection elements 241, 242, and 243 are arranged to detect corresponding secondary electron beams 261, 262, and 263 and generate corresponding signals which are sent to controller 109 or a signal processing system (not shown), e.g., to construct images of the corresponding scanned areas of sample 208.

In some embodiments, detection elements 241, 242, and 243 detect corresponding secondary electron beams 261, 262, and 263, respectively, and generate corresponding intensity signal outputs (not shown) to an image processing system (e.g., controller 109). In some embodiments, each detection element 241, 242, and 243 may comprise one or more pixels. The intensity signal output of a detection element may be a sum of signals generated by all the pixels within the detection element.

In some embodiments, controller 109 may comprise image processing system that includes an image acquirer (not shown), a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 240 of apparatus 104 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 240 and may construct an image. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time sequence. The multiple images may be stored in the storage. In some embodiments, controller 109 may be configured to perform image processing steps with the multiple images of the same location of sample 208.

In some embodiments, controller 109 may include measurement circuitries (e.g., analog-to-digital converters) to obtain a distribution of the detected secondary electrons. The electron distribution data collected during a detection time window, in combination with corresponding scan path data of each of primary beamlets 211, 212, and 213 incident on the wafer surface, can be used to reconstruct images of the wafer structures under inspection. The reconstructed images can be used to reveal various features of the internal or external structures of sample 208, and thereby can be used to reveal any defects that may exist in the wafer.

In some embodiments, controller 109 may control motorized stage 209 to move sample 208 during inspection of sample 208. In some embodiments, controller 109 may enable motorized stage 209 to move sample 208 in a direction continuously at a constant speed. In other embodiments, controller 109 may enable motorized stage 209 to change the speed of the movement of sample 208 overtime depending on the steps of scanning process.

Although FIG. 2 shows that apparatus 104 uses three primary electron beams, it is appreciated that apparatus 104 may use two or more number of primary electron beams. The present disclosure does not limit the number of primary electron beams used in apparatus 104. In some embodiments, apparatus 104 may be a SEM used for lithography.

Compared with a single charged-particle beam imaging system ("single-beam system"), a multiple charged-particle beam imaging system ("multi-beam system") may be designed to optimize throughput for different scan modes. Embodiments of this disclosure provide a multi-beam system with the capability of optimizing throughput for different scan modes by using beam arrays with different geometries. adapting to different throughputs and resolution requirements.

A non-transitory computer readable medium may be provided that stores instructions for a processor (e.g., processor of controller 109 of FIGS. 1-2) to carry out image processing, data processing, beamlet scanning, database management, graphical display, operations of a charged particle beam apparatus, or another imaging device, or the like. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

Figure 3:
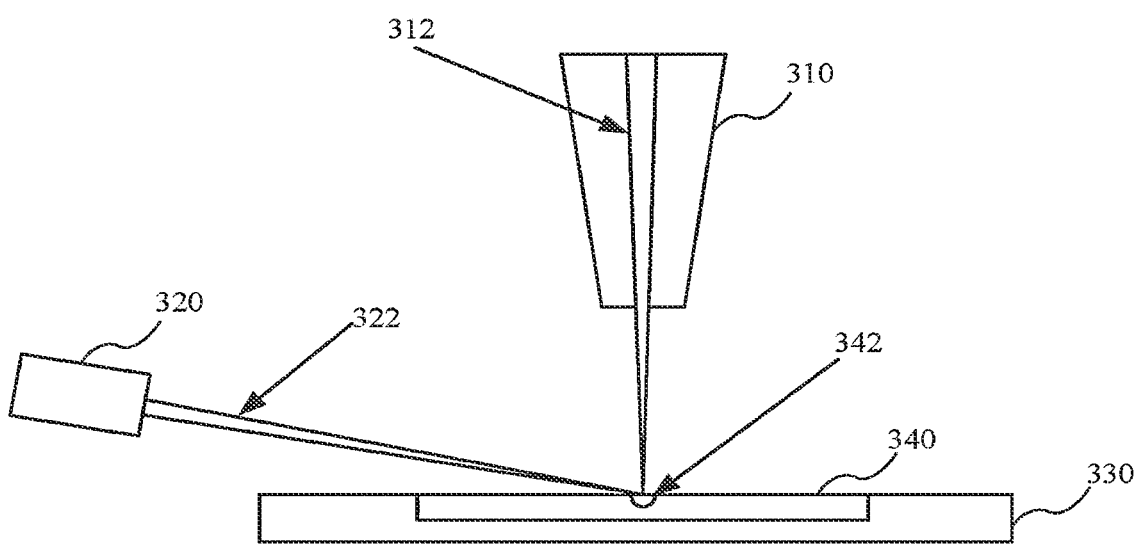
FIG. 3 is a schematic diagram illustrating an exemplary electron beam system, consistent with embodiments of the present disclosure.

FIG. 3 illustrates an electron beam system 300 consistent with embodiments of the present disclosure. As shown in FIG. 3, electron beam system 300 includes an electron beam tool 310 (e.g., electron beam tool 104 of FIG. 2, electron beam tool 710A of FIG. 7A, or electron beam tool 710B of FIG. 7B), an ACC module 320 (e.g., ACC modules 720A, 722A, 724A, or 726A of FIG. 7A, ACC module 720B of FIG. 7B, or ACC module configuration 800A of FIG. 8A), and a wafer holder 330 (e.g., motorized stage 209 of FIG. 2, wafer holder 730A of FIG. 7A, or wafer holder 730B of FIG. 7B) on which a sample (e.g., sample 208 of FIG. 2, wafer 740A of FIG. 7A, or wafer 740B of FIG. 7B) to be inspected (e.g., a wafer 340) is disposed. Electron beam tool 310 may emit a primary electron beam 312 (e.g., primary electron beam 202 of FIG. 2, primary electron beam 712A of FIG. 7A, or primary electron beam 712B of FIG. 7B) onto an area of interest on wafer 340, and collect secondary electrons emanated from the wafer surface to form an image of the area of interest on wafer 340. ACC module 320 may include an ACC beam source that emits a light beam 322 (e.g., laser beam, light beams 750A, 752A, 754A, or 756A of FIG. 7A, light beam 752B of FIG. 7B, or light beam 822 of FIG. 8A or 8B) onto wafer 340 and form a beam spot 342 (e.g., area of interest 742A of FIG. 7A, area of interest 742B of FIG. 7B, beam spots 742C of FIG. 7C, or beam spot 842 of FIG. 8A or 8B) of light beam 322 on the wafer surface during inspection. When primary electron beam 312 irradiates the area of interest on wafer 340, charges may be accumulated due to a large electron beam current. Light beam 322 emitted from ACC module 320 may be configured to regulate the accumulated charges due to photoconductivity or photoelectric effect, or a combination of photoconductivity and photoelectric effect, among others.

In some embodiments, wafer 340 may include a PN junction diode (e.g., PN junction diode 600 of FIG. 6) or bulk semiconductor material. In some embodiments, the ACC beam source may be a laser source.

In some embodiments, electron beam tool 310 may generate multiple primary electron beamlets to simultaneously scan multiple locations on wafer 340. In some embodiments, the beam projected by ACC module 320 may charge a location on wafer 340 large enough so that multiple primary electron beamlets may scan corresponding portions on wafer 340. In some embodiments, electron beam tool 310 may include a plurality of ACC modules 320 to project a beam onto wafer 340 for each primary electron beamlet, a plurality of the primary electron beamlets, or any combination thereof.

Figure 4:
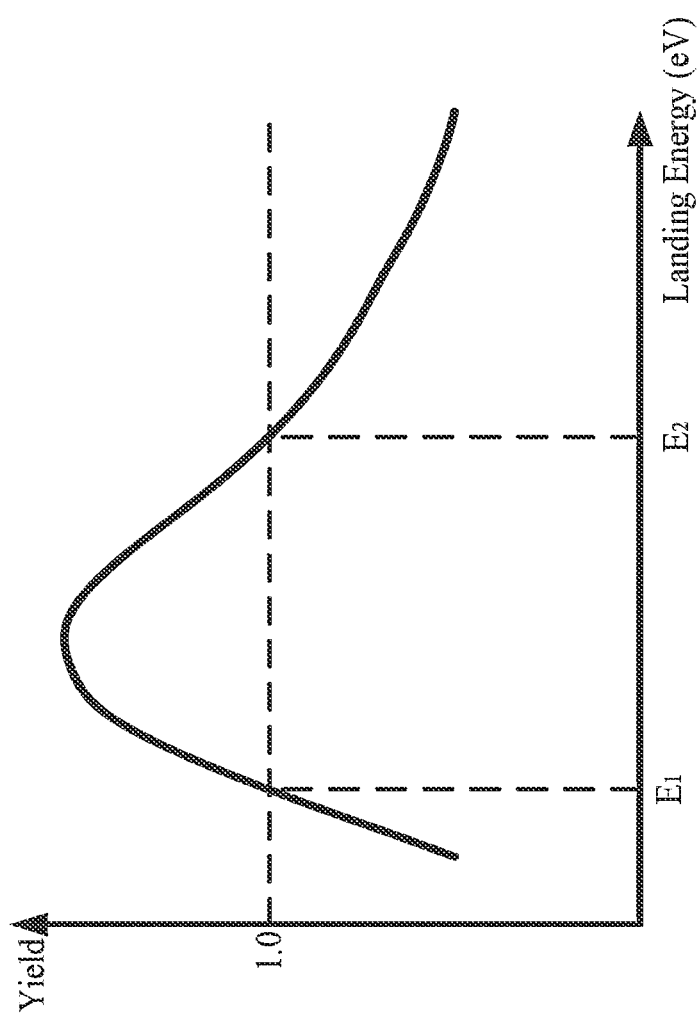
FIG. 4 is an exemplary graph showing a yield rate of secondary electrons relative to landing energy of primary electron beamlets, consistent with embodiments of the present disclosure.

FIG. 4 illustrates an exemplary graph showing a yield rate of secondary electrons relative to landing energy of primary electron beamlets, consistent with embodiments of the present disclosure. The graph illustrates the relationship of the landing energy of a plurality of beamlets of a primary electron beam (e.g., plurality of beamlets 211, 212, or 213 of primary electron beam 202 of FIG. 2, primary electron beam 312 of FIG. 3, primary electron beam 712A of FIG. 7A, or primary electron beam 712B of FIG. 7B) and the yield rate of secondary electron beams (e.g., secondary electron beams 261, 262, or 263 of FIG. 2). The yield rate indicates the number of secondary electrons that are produced in response to the impact of the primary electrons. For example, a yield rate greater than 1.0 indicates that more secondary electrons may be produced than the number of primary electrons that have landed on the wafer. Similarly, a yield rate of less than 1.0 indicates that less secondary electrons may be produced in response to the impact of the primary electrons.

As shown in the graph of FIG. 4, when the landing energy of the primary electrons is within a range from $E_1$ to $E_2$, more electrons may leave the surface of the wafer than land onto the surface of the wafer, which may result in a positive electrical potential at the surface of the wafer. In some embodiments, defect inspection may be performed in the foregoing range of landing energies, which is called "positive mode." An electron beam tool (e.g., electron beam tool 104 of FIG. 2, electron beam tool 310 of FIG. 3, electron beam tool 710A of FIG. 7A, or electron beam tool 710B of FIG. 7B) may generate a darker voltage contrast image of a device structure with a more positive surface potential since a detection device (e.g., detection device 240 of FIG. 2) may receive less secondary electrons (see FIG. 5).

When the landing energy is lower than $E_1$ or higher than $E_2$, less electrons may leave the surface of the wafer, thereby resulting in a negative electrical potential at the surface of the wafer. In some embodiments, defect inspection may be performed in this range of the landing energies, which is called "negative mode." An electron beam tool (e.g., electron beam tool 104 of FIG. 2) may generate a brighter voltage contrast image of a device structure with a more negative surface potential a detection device (e.g., detection device 240 of FIG. 2) may receive more secondary electrons (see FIG. 5).

When a primary electron beam irradiates the area of interest on the wafer, charges may be accumulated due to a large electron beam current. A light beam emitted from an ACC module (e.g., ACC module 320 of FIG. 3, ACC modules 720A, 722A, 724A, or 726A of FIG. 7A, ACC module 720B of FIG. 7B, or ACC module configuration 800A of FIG. 8A) may be configured to regulate the accumulated charges due to photoconductivity or photoelectric effect, or a combination of photoconductivity and photoelectric effect, among others.

In some embodiments, the landing energy of the primary electron beams may be controlled by the total bias between the electron source and the wafer.

Figure 5:
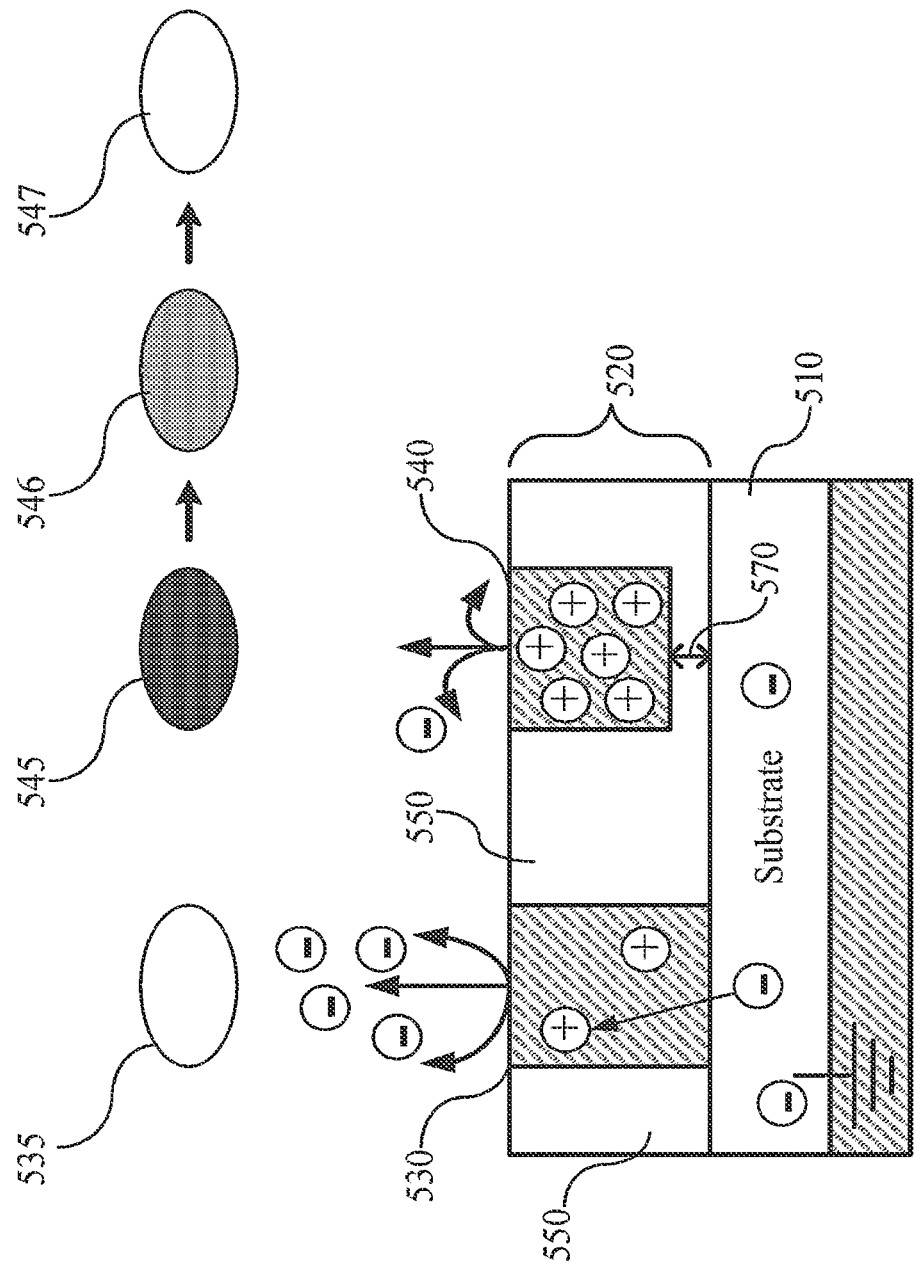
FIG. 5 is a schematic diagram illustrating an exemplary a voltage contrast response of a wafer, consistent with embodiments of the present disclosure.

FIG. 5 illustrates a schematic diagram of a voltage contrast response of a wafer, consistent with embodiments of the present disclosure. In some embodiments, physical and electrical defects in a wafer (e.g., resistive shorts and opens, defects in deep trench capacitors, back end of line (BEOL) defects, etc.) can be detected using a voltage contrast method of a charged particle inspection system. Defect detection using voltage contrast images may use one or more ACC modules (e.g., ACC module 320 of FIG. 3, ACC modules 720A, 722A, 724A, or 726A of FIG. 7A, ACC module 720B of FIG. 7B, or ACC module configuration 800A of FIG. 8A), where one or more light beams (e.g., light beam 322 of FIG. 3, light beams 750A, 752A, 754A, or 756A of FIG. 7A, light beam 752B of FIG. 7B, or light beam 822 of FIG. 8A or 8B) are applied to an area of the wafer (e.g., sample 208 of FIG. 2, wafer 340 of FIG. 3, wafer 740A of FIG. 7A, or wafer 740B of FIG. 7B) to be inspected.

In some embodiments, an electron beam tool (e.g., electron beam tool 104 of FIG. 2, electron beam tool 310 of FIG. 3, electron beam tool 710A of FIG. 7A, or electron beam tool 710B of FIG. 7B) may be used to detect defects in internal or external structures of a wafer by illuminating the wafer with a plurality of beamlets of a primary electron beam (e.g., plurality of beamlets 211, 212, or 213 of primary electron beam 202 of FIG. 2, primary electron beam 312 of FIG. 3, primary electron beam 712A of FIG. 7A, or primary electron beam 712B of FIG. 7B) and measuring a voltage contrast response of the wafer to the illumination. In some embodiments, the wafer may comprise a test device region 520 that is developed on a substrate 510. In some embodiments, test device region 520 may include multiple device structures 530 and 540 separated by insulating material 550. For example, device structure 530 is connected to substrate 510. In contrast, device structure 540 is separated from substrate 510 by insulating material 550 such that a thin insulator structure 570 (e.g., thin oxide) exists between device structure 540 and substrate 510.

The electron beam tool may generate secondary electrons (e.g., secondary electron beams 261, 262, or 263 of FIG. 2) from the surface of test device region 520 by scanning the surface of test device region 520 with a plurality of beamlets of a primary electron beam. As explained above, when the landing energy of the primary electrons is between $E_1$ and $E_2$ (i.e., the yield rate is greater than 1.0 in FIG. 4), more electrons may leave the surface of the wafer than land on the surface, thereby resulting in a positive electrical potential at the surface of the wafer.

As shown in FIG. 5, a positive electrical potential may build-up at the surface of a wafer. For example, after an electron beam tool scans test device region 520 (e.g., during a pre-scanning process), device structure 540 may retain more positive charges because device structure 540 is not connected to an electrical ground in substrate 510, thereby resulting in a positive electrical potential at the surface of device structure 540. In contrast, primary electrons with the same landing energy (i.e., the same yield rate) applied to device structure 530 may result in less positive charges retained in device structure 530 since positive charges may be neutralized by electrons supplied by the connection to substrate 510. In some embodiments, a light beam emitted from an ACC module may be configured to regulate charges that accumulate due to photoconductivity or photoelectric effect, or a combination of photoconductivity and photoelectric effect, among others.

An image processing system (e.g., controller 109 of FIG. 2) of an electron beam tool may generate voltage contrast images 535 and 545 of corresponding device structures 530 and 540, respectively. For example, device structure 530 is shorted to the ground and may not retain built-up positive charges. Accordingly, when primary electron beamlets land on the surface of the wafer during inspection, device structure 530 may repel more secondary electrons thereby resulting in a brighter voltage contrast image. In contrast, because device structure 540 has no connection to substrate 510 or any other grounds, device structure 540 may retain a build-up of positive charges. This build-up of positive charges may cause device structure 540 to repel less secondary electrons during inspection, thereby resulting in a darker voltage contrast image.

The built-up surface potential level may change during inspection due to the effects of electrical breakdown or tunneling, thereby resulting in failure to detect defects. For example, when a high voltage is applied to a high resistance thin device structure (e.g., thin oxide), such as an insulator structure 570, leakage current may flow through the high resistance structure, thereby preventing the structure from functioning as a perfect insulator. This may affect circuit functionality and result in a device defect. A similar effect of leakage current may also occur in a structure with improperly formed materials or a high resistance metal layer, for example a cobalt silicide (e.g., $CoSi$, $CoSi_2$, $Co_2Si$, $Co_3Si$, etc.) layer between a tungsten plug and a source or drain area of a field-effect transistor (FET).

Figure 6:
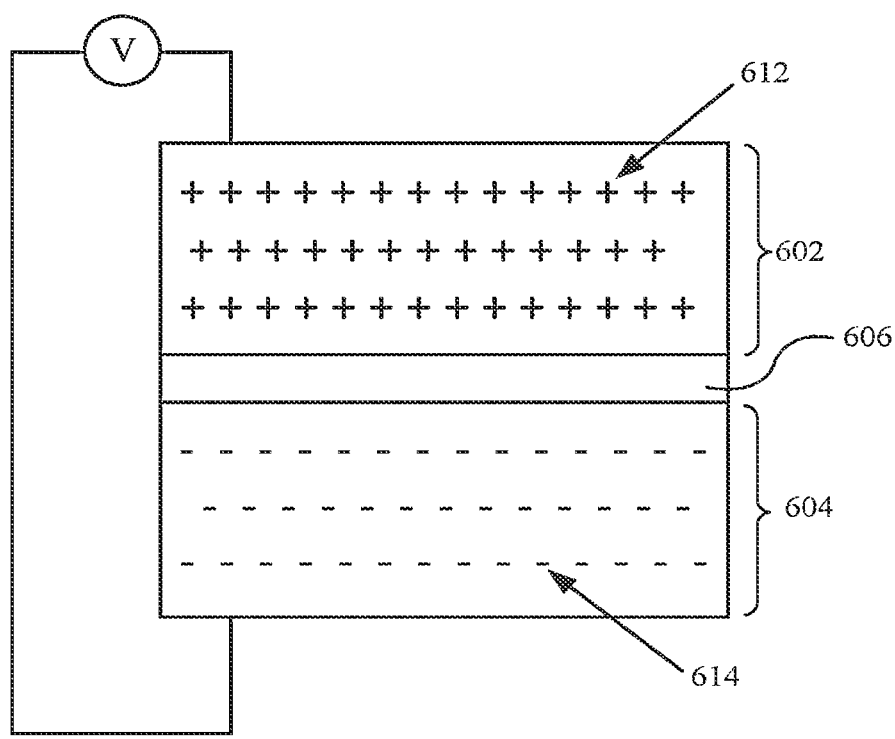
FIG. 6 is an exemplary PN junction diode consistent with embodiments of the present disclosure.

FIG. 6 illustrates an exemplary PN junction diode 600 consistent with embodiments of the present disclosure. In some embodiments, a light beam (e.g., light beam 322 of FIG. 3, light beams 750A, 752A, 754A, or 756A of FIG. 7A, light beam 752B of FIG. 7B, or light beam 822 of FIG. 8A or 8B) emitted from an ACC module (e.g., ACC module 320 of FIG. 3, ACC modules 720A, 722A, 724A, or 726A of FIG. 7A, ACC module 720B of FIG. 7B, or ACC module configuration 800A of FIG. 8A) and applied to PN junction diode 600 may be adjusted to adjust the number of free electrons (e.g., free electron density) generated in PN junction diode 600. As shown in FIG. 6, PN junction diode 600 includes a p-region 602, an n-region 604, and a PN junction 606. PN junction diode 600 may be formed when a p-type semiconductor (e.g., p-region 602) is fused to an n-type semiconductor (e.g., n-region 604), which may create a potential barrier voltage across PN junction 606. P-region 602 may include positively-charged holes 612 while n-region 604 may include negatively-charged electrons 614. PN junction 606 may not include any charge carriers (e.g., PN junction 606 may be a depletion region). In some embodiments, the current flow and the resistance of PN junction diode 600 may vary with the number of free electrons generated in PN junction diode 600. Therefore, a light beam emitted from an ACC module may be used to control the charge on PN-junction diode 600.

Semiconductor structures have outer shell atomic levels that exhibit an energy band structure, which includes a valence band, an energy gap, and a conduction band. When an external energy (e.g., light beam 322 of FIG. 3, light beams 750A, 752A, 754A, or 756A of FIG. 7A, light beam 752B of FIG. 7B, or light beam 822 of FIG. 8A or 8B) is applied to a semiconductor, the valence electrons (e.g., electrons 614) may gain enough energy to break their bonding with a parent atom and jump across a depletion layer (e.g., PN junction 606) from the valence band (e.g., n-region 604) to the conduction band (e.g., p-region 602). The free electrons in a conduction band are able to move freely due to their detachment from parent atoms. When the electron jumps from the valence band to the conduction band, a hole (e.g., hole 612) is created in the valence band. Thus in semiconductors, pairs of free electrons and holes are generated when electrons jump the energy gap, thereby resulting in current passing through PN-junction diode 600. In some cases, variations in temperature cause variations in the vibrations of atoms in a semiconductor, thereby resulting in changes in current flow in the semiconductor.

During operation, physical changes in a device may result in application of a negative voltage (e.g., reverse bias) to PN junction diode 600, which may result in free charges pulling away from PN-junction 606, thereby resulting in widening of PN-junction 606. An increase in the width of PN-junction 606 may result in an increase or decrease of the effective resistance of PN junction 606, which may permit or block the flow of current through PN junction 606. In some cases, an increase in reverse bias voltage applied to PN-junction diode 600 may cause PN-junction 606 to overheat and fail due to the avalanche effect around PN-j unction 606.

The diode current $I_d$ of PN junction 606 may be described by the following equation (1):

$$I_d(V_A) = I_0 \left( e^{\frac{qV_A}{kT}} - 1 \right) \quad (1)$$

where e is Euler's constant, $I_0$ is the reverse saturation current, q is the quantity of electric charge, $V_A$ is the diode voltage, k is Boltzmann's constant, and T is the temperature of PN junction 306. The reverse saturation current $I_0$ may be defined by the following equation (2):

$$I_0 = (g_T + g_{ph}) q (L_p + L_n) \quad (2)$$

where $g_T$ is the amount of charge generated due to thermal effects, $g_{ph}$ is the amount of charge generated due to photon-induced effects, q is the quantity of electric charge, $L_p$ is the diffusion length of hole 612 into n-region 604, and $L_n$ is the diffusion length of electron 614 into p-region 602. As seen by equations (1) and (2), the diode current $I_d$ of PN junction 606 may vary with variations in the amount of charge generated due to photon-induced effects or thermal effects. For example, when a light beam is emitted onto PN junction 606, the amount of charge generated $g_{ph}$ may increase, thereby resulting in an increase in the diode current $I_d$. During inspection, ACC modules typically operate at low power, which may result in changes in the diode current $I_d$ being mostly attributable to changes in $g_{ph}$ rather than changes in $g_T$. That is, ACC modules that operate at low power typically generate charges due to photons rather than heat transfer.

Similarly, in bulk semiconductor materials, the photo-electric current $I_{ph}$ may be described by the following equation (3):

$$I_{ph} = qns(\mu_n + \mu_p) V/L \quad (3)$$

where q is the quantity of electric charge, n is the photon-generated carrier density, s is the cross-sectional area, V is the applied voltage, L is the length, $\mu_n$ is the mobility of the electrons, and $\mu_p$ is the mobility of the holes in the bulk semiconductor material. The mobility of the electrons $\mu_n$ and the mobility of the holes $\mu_p$ may each be described by the following equation (4):

$$\frac{1}{\mu} = \frac{1}{a_L} * T^{\frac{3}{2}} + \frac{1}{a_I} * T^{-\frac{3}{2}} \quad (4)$$

where $a_L$ is the coefficient of the effective mass of the electron or the hole that is induced by the bulk material lattice and $\alpha_I$ is the coefficient of the effective mass of the electron or the hole that is induced by the bulk material ions.

As seen by equations (3) and (4), the photo-electric current $I_{ph}$ of a bulk semiconductor material may vary with variations in temperature or photon-generated carrier density. For example, when a light beam is emitted onto a bulk semiconductor material, the photo-electric current $I_{ph}$ of a bulk semiconductor material may increase. During inspection, ACC modules typically operate at low power, which may result in changes in the photo-electric current $I_{ph}$ of a bulk semiconductor material being mostly attributable to changes in n rather than changes in T. That is, ACC modules that operate at low power typically generate charges due to photons rather than heat transfer.

A light beam emitted from an ACC module and applied to a semiconductor may be adjusted to adjust the number of free electrons (e.g., free electron density) generated in the semiconductor. As shown by equations (1)-(4) described above (see, e.g., the amount of charge generated, the quantity of electric charge, the diffusion lengths of holes or electrons, photon-generated carrier density, mobility of holes or electrons), the number of free electrons generated affects the current flow in a semiconductor. For example, as the number of free electrons generated increases in a semiconductor, the current flow in the semiconductor increases and the resistance in the semiconductor decreases. Therefore, a light beam emitted from an ACC module may be used to control the charge on a semiconductor structure (e.g., improve the conductivity in a PN junction).

An ACC module may charge a wafer with the desired luminous energy during inspection by providing a light beam with higher luminous energy to the wafer such that a higher power density is provided to the wafer and thus, higher processing speeds are achieved during operation of wafer inspection. As a result, a lower magnification can be obtained and, therefore, a beam with a sufficiently high beam density and luminous energy can reach the wafer.

Although ACC modules may be employed to control accumulated charges on a sample during inspection, these ACC modules do not necessarily simulate operating conditions of the sample. For example, many failures in ICs are caused by high temperatures in P-N junctions. Although ACC modules have some heating effects on a sample, these heating effects are indistinguishable from light-induced effects using voltage contrast when an ACC module is used to emit a beam directly onto a pixel to heat the pixel during inspection. Since the effective resistance and voltage of a material varies with current, the voltage contrast of a sample may vary with changes in the amount of generated charge. However, since the current of a sample may vary due to photon-induced effects or thermal effects, variations in voltage contrast due to photon-induced effects may not be distinguishable from variations in voltage contrast due to thermal effects when an ACC module emits a beam directly onto a pixel to heat the pixel during inspection. For example, variations in the effective resistance and voltage of a material may vary due to changes in the generation of free electrons caused by applied light beams or changes in temperature.

Systems and methods using one or more ACC modules to indirectly heat areas of a sample, thereby allowing detection of light-induced defects and heat-induced defects using voltage contrast, may be needed since heating the sample stage may cause issues with machine metrology (e.g., the stage may drift with changes in temperature) or inspection signals for detecting precise locations on the sample (e.g., heating the stage may affect other components of the system such as lenses, detectors, etc.).

FIGS. 7A and 7B illustrate electron beam systems 700A and 700B, respectively, consistent with embodiments of the present disclosure. FIG. 7C is a top view 700C of electron beam systems 700A or 700B during operation of wafer inspection, consistent with embodiments of the present disclosure. As shown in FIG. 7A, electron beam system 700A includes an electron beam tool 710A (e.g., electron beam tool 104 of FIG. 2 or electron beam tool 310 of FIG. 3), a wafer holder 730A (e.g., motorized stage 209 of FIG. 2 or wafer holder 330 of FIG. 3) on which a sample (e.g., sample 208 of FIG. 2 or wafer 340 of FIG. 3) to be inspected (e.g., wafer 740A) is disposed, and ACC modules 720A, 722A, 724A, and 726A (e.g., ACC module 320 of FIG. 3). Electron beam tool 710A may emit a primary electron beam 712A (e.g., primary electron beam 202 of FIG. 2 or primary electron beam 312 of FIG. 3) onto an area of interest 742A (e.g., beam spot 342 of FIG. 3) on wafer 740A, and collect secondary electrons emanated from the wafer surface to form an image of the area of interest on wafer 740A. ACC modules 720A, 722A, 724A, and 726A may include ACC beam sources that each emit a light beam 750A, 752A, 754A, and 756A (e.g., laser beams or light beam 322 of FIG. 3), respectively, onto wafer 740A during inspection.

Although four ACC modules are shown in FIG. 7A, electron beam system 700A may include any number of ACC modules. Similarly, each light beam 750A, 752A, 754A, or 756A may include a plurality of light beams. In some embodiments, electron beam system 700A may include one ACC module that includes one or a plurality of ACC beam sources.

In some embodiments, electron beam tool 710A may generate multiple primary electron beamlets to simultaneously scan multiple locations on wafer 740A. In some embodiments, the beams projected by ACC modules 720A, 722A, 724A, and 726A may charge a location on wafer 740A large enough so that multiple primary electron beamlets may scan corresponding portions on wafer 740A. In some embodiments, ACC modules 720A, 722A, 724A, and 726A may project a beam onto wafer 740A for each primary electron beamlet, a plurality of the primary electron beamlets, or any combination thereof.

As shown in FIG. 7B, electron beam system 700B includes an electron beam tool 710B (e.g., electron beam tool 104 of FIG. 2 or electron beam tool 310 of FIG. 3), a wafer holder 730B (e.g., motorized stage 209 of FIG. 2 or wafer holder 330 of FIG. 3) on which a sample (e.g., sample 208 of FIG. 2 or wafer 340 of FIG. 3) to be inspected (e.g., wafer 740B) is disposed, and an ACC module 720B (e.g., ACC module 320 of FIG. 3). Electron beam tool 710B may emit a primary electron beam 712B onto an area of interest 742B (e.g., beam spot 342 of FIG. 3) on wafer 740B, and collect secondary electrons emanated from the wafer surface to form an image of the area of interest on wafer 740B. ACC module 720B may include an ACC beam source that emits a light beam 752B (e.g., a laser beam or light beam 322 of FIG. 3) during inspection.

Electron beam system 700B may include beam splitters 762B and mirrors 772B. In some embodiments, beam splitters 762B may each be configured to split an emitted beam while each of mirrors 772B may be configured to reflect a light beam. For example, beam splitters 762B may be configured to split light beam 752B into a plurality of light beams while mirrors 772B may be configured to reflect the plurality of light beams 752B such that four light beams 752B are directed onto wafer 740B during inspection.

Although one ACC module is shown in FIG. 7B, electron beam system 700B may include any number of ACC modules. Similarly, electron beam system 700B may include any number of beam splitters 762B or mirrors 772B such that any number of light beams 752B may be directed onto wafer 740B during inspection. In some embodiments, beam splitters 762B or mirrors 772B may be included in ACC module 720B.

In some embodiments, electron beam tool 710B may generate multiple primary electron beamlets to simultaneously scan multiple locations on wafer 740B. In some embodiments, the beams projected by ACC module 720B may charge a location on wafer 740B large enough so that multiple primary electron beamlets may scan corresponding portions on wafer 740B. In some embodiments, ACC module 720B may project a beam onto wafer 740B for each primary electron beamlet, a plurality of the primary electron beamlets, or any combination thereof.

As shown in FIG. 7C, top view 700C of electron beam systems 700A or 700B may include beam spots 742C (e.g., beam spot 342 of FIG. 3, area of interest 742A of FIG. 7A, or area of interest 742B of FIG. 7B) emitted from one or more ACC modules (e.g., ACC module 320 of FIG. 3, ACC modules 720A, 722A, 724A, or 726A of FIG. 7A, or ACC module 720B of FIG. 7B) and a pixel 780C in the field of view (FOV) of electron beam tools 710A or 710B. In some embodiments, pixel 780C may include a plurality of pixels. To simplify the illustration, electron beam tools 710A or 710B (e.g., electron beam tool 104 of FIG. 2 or electron beam tool 310 of FIG. 3) are omitted from FIG. 7C. In some embodiments, a special designed sample surface may be used to collect the one or more light beam signals emitted from ACC modules 720A, 722A, 724A, or 726A of FIG. 7A or ACC module 720B of FIG. 7B (e.g., ACC module 320 of FIG. 3). In yet other embodiments, the wafer surface or a smooth surface may also be used to collect the one or more light beam signals emitted from ACC modules 720A, 722A, 724A, or 726A of FIG. 7A or ACC module 720B of FIG. 7B.

In some embodiments, beam spots 742C emitted from one or more ACC modules may illuminate an area adjacent to pixel 780C on a wafer. In some embodiments, the area may include a plurality of areas or the pixel may include a plurality of pixels. Beam spots 742C may indirectly heat pixel 780C such that beam spots 742C do not cause light-induced carrier density changes at pixel 780C. For example, thermal energy 790C may be diffused from each beam spot 742C into pixel 780C without beam spots 742C directly exposing pixel 780C to any photons from beam spots 742C, thereby mitigating any sources or causes of direct photon-induced effects at pixel 780C. In some embodiments, mitigating a cause of a direct photon-induced effect at pixel 780C may include generating substantially zero photon-induced charges at pixel 780C or generating substantially zero photon-induced carrier density changes at pixel 780C since beam spot 742C may only illuminate an area adjacent to pixel 780C rather than illuminate pixel 780C. In some embodiments, mitigating a cause of a direct photon-induced effect at pixel 780C may include minimizing or reducing an impact of a cause of a direct photon-induced effect at pixel 780C. In some embodiments, one or more separate laser sources (e.g., from one or more ACC modules) may be configured to tune a plurality of surface charges on the wafer in order to control accumulated charges on the wafer during inspection.

In some embodiments, the ACC beam source may be a laser (e.g., an infrared laser, a visible laser, an ultraviolet laser, a multi-laser configuration, etc.). For example, the ACC beam source may include a laser with a wavelength less than the energy bandgap of the target material in order to generate heat in the material. When the laser has a wavelength that is less than the energy bandgap of the target material, the photons of the laser have more energy than the energy bandgap, thereby resulting in the photos exciting the electrons in the target material such that heat is generated in the target material.

In some embodiments, thermal diffusion caused by beam spots 742C may cause pixel 780C to reach temperatures of operating devices that include pixel 780C (e.g., 40-100° C.), thereby advantageously simulating operating conditions of the wafer. The thermal diffusion may induce a defect in pixel 780C. In some embodiments, the defect may include a plurality of defects. In some embodiments, electron beam systems 700A or 700B may be configured to detect the one or more defects in pixel 780C using voltage contrast. Since pixel 780C is not directly exposed to beam spots 742C, photon-induced defects may be distinguishable from thermally-induced defects using voltage contrast during inspection. For example, variations in the effective resistance and voltage of a material due to photon-induced changes in the generation of free electrons may be distinguished from thermally-induced changes in the generation of free electrons.

In some embodiments, when the ACC beam source includes a laser (e.g., an infrared laser) with a wavelength less than the energy bandgap of the target material, the ACC beam source may emit a beam spot directly onto a pixel, thereby generating heat in the material while mitigating any sources or causes of direct photon-induced defects, light-induced carrier density changes, or photoelectric effects at the pixel.

In some embodiments, such as the embodiments illustrated in FIG. 7A, 7B, or 7C, ACC modules 720A, 722A, 724A, or 726A ACC module 720B are disposed outside of a vacuum chamber, in which electron beam tools 710A or 710B and wafer 740A or 740B are disposed. During operation of the electron beam systems 700A, 700B, or 700C, light beams 750A, 752A, 754A, 756A, or 752B may pass through one or more windows formed in the vacuum chamber. In some alternative embodiments, ACC modules 720A, 722A, 724A, 726A, or 720B may be disposed inside of the vacuum chamber.

Figure 8A:
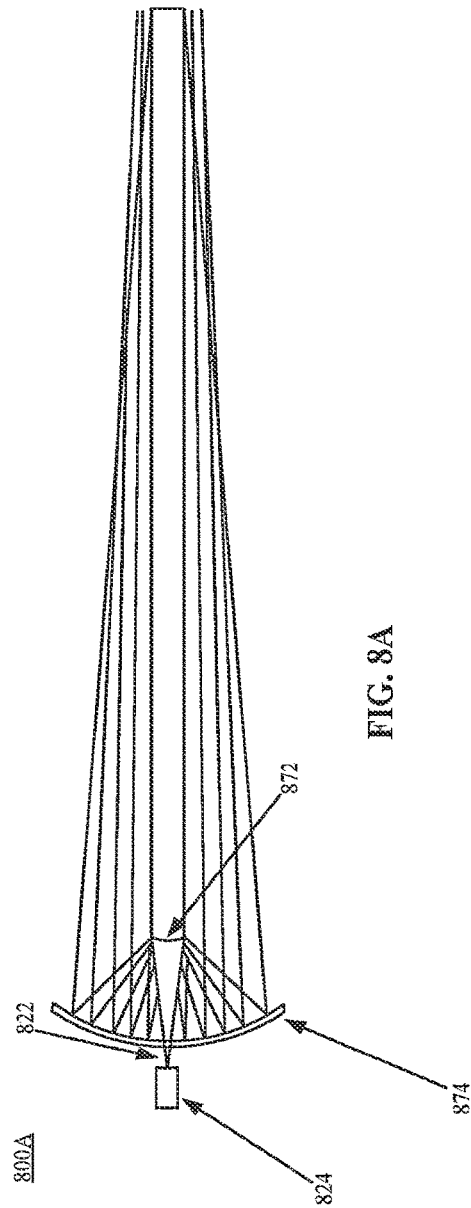
FIG. 8A is a schematic diagram illustrating an exemplary ACC module configuration, consistent with embodiments of the present disclosure.
Figure 8B:
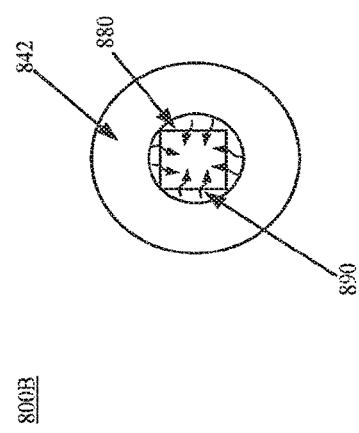
FIG. 8B is a schematic diagram illustrating a top view of the ACC module configuration of FIG. 8A, consistent with embodiments of the present disclosure.

FIG. 8A is an exemplary ACC module configuration 800A, consistent with embodiments of the present disclosure. FIG. 8B is a top view 800B of an electron beam system including ACC module configuration 800A (e.g., ACC module 320 of FIG. 3) during operation of wafer inspection, consistent with embodiments of the present disclosure.

As shown in FIG. 8A, ACC module configuration 800A may include an ACC beam source 824 and parabolic mirrors 872 and 874. ACC beam source may emit a plurality of light beams 822. Parabolic mirror 872 may be configured to reflect each light beam 822 to parabolic mirror 874. Parabolic mirror 874 may be configured to receive each light beam 822 (e.g., light beam 322 of FIG. 3) and reflect each light beam 822 to an area adjacent to a pixel on a wafer (e.g., sample 208 of FIG. 2 or wafer 340 of FIG. 3). ACC module configuration 800A may include any number of ACC beam sources or parabolic mirrors. In some embodiments, the area may include a plurality of areas or the pixel may include a plurality of pixels.

As shown in FIG. 8B, top view 800B of an electron beam system including ACC module configuration 800A may include beam spot 842 emitted from one or more ACC beam sources 824 and a pixel 880 in the FOV of an electron beam tool (e.g., electron beam tool 104 of FIG. 2 or electron beam tool 310 of FIG. 3). In some embodiments, beam spot 842 (e.g., beam spot 342 of FIG. 3) may be a ring shape formed by light beams 822. In some embodiments, beam spot 842 may surround pixel 880. In some embodiments, pixel 880 may include a plurality of pixels. To simplify the illustration, the electron beam tools are omitted from FIG. 8B. In some embodiments, a special designed sample surface may be used to collect the one or more light beam signals emitted from ACC beam sources 824. In yet other embodiments, the wafer surface or a smooth surface may also be used to collect the one or more light beam signals emitted from ACC beam sources 824.

In some embodiments, beam spot 842 formed by light beams 822 may illuminate an area adjacent to pixel 880 on a wafer. Beam spot 842 may indirectly heat pixel 880 such that beam spot 842 does not cause light-induced carrier density changes at pixel 880. For example, thermal energy 890 may be diffused from beam spot 842 into pixel 880 without beam spot 842 directly exposing pixel 880 to any photons from beam spot 842, thereby mitigating, reducing, or minimizing any sources or causes of direct photon-induced effects at pixel 880. In some embodiments, mitigating a cause of a direct photon-induced effect at pixel 880 may include generating substantially zero photon-induced charges at pixel 880 or generating substantially zero photon-induced carrier density changes at pixel 880 since beam spot 842 may only illuminate an area adjacent to pixel 880 rather than illuminate pixel 880. In some embodiments, mitigating a cause of a direct photon-induced effect at pixel 880 may include minimizing or reducing an impact of a cause of a direct photon-induced effect at pixel 880. In some embodiments, one or more separate laser sources (e.g., from one or more ACC modules) may be configured to tune a plurality of surface charges on the wafer in order to control accumulated charges on the wafer during inspection.

In some embodiments, ACC beam source 824 may be a laser (e.g., an infrared laser, a visible laser, an ultraviolet laser, a multi-laser configuration, etc.). For example, ACC beam source 824 may include a laser with a wavelength less than the energy bandgap of the target material in order to generate heat in the material. When the laser has a wavelength that is less than the energy bandgap of the target material, the photons of the laser have more energy than the energy bandgap, thereby resulting in the photos exciting the electrons in the target material such that heat is generated in the target material.

In some embodiments, thermal diffusion caused by beam spot 842 may cause pixel 880 to reach temperatures of operating devices that include pixel 880 (e.g., 40-100° C.), thereby advantageously simulating operating conditions of the wafer. In some embodiments, the thermal diffusion may induce a defect in pixel 880. In some embodiments, the defect may include a plurality of defects. In some embodiments, the electron beam systems may be configured to detect the one or more defects in pixel 880 using voltage contrast. Since pixel 880 is not directly exposed to beam spot 842, photon-induced defects may be distinguishable from thermally-induced defects using voltage contrast during inspection. For example, variations in the effective resistance and voltage of a material due to photon-induced changes in the generation of free electrons may be distinguished from thermally-induced changes in the generation of free electrons.

In some embodiments, when the ACC beam source includes a laser (e.g., an infrared laser) with a wavelength less than the energy bandgap of the target material, the ACC beam source may emit a beam spot directly onto a pixel, thereby generating heat in the material while mitigating any sources or causes of direct photon-induced defects, light-induced carrier density changes, or photoelectric effects at the pixel.

Figure 9:
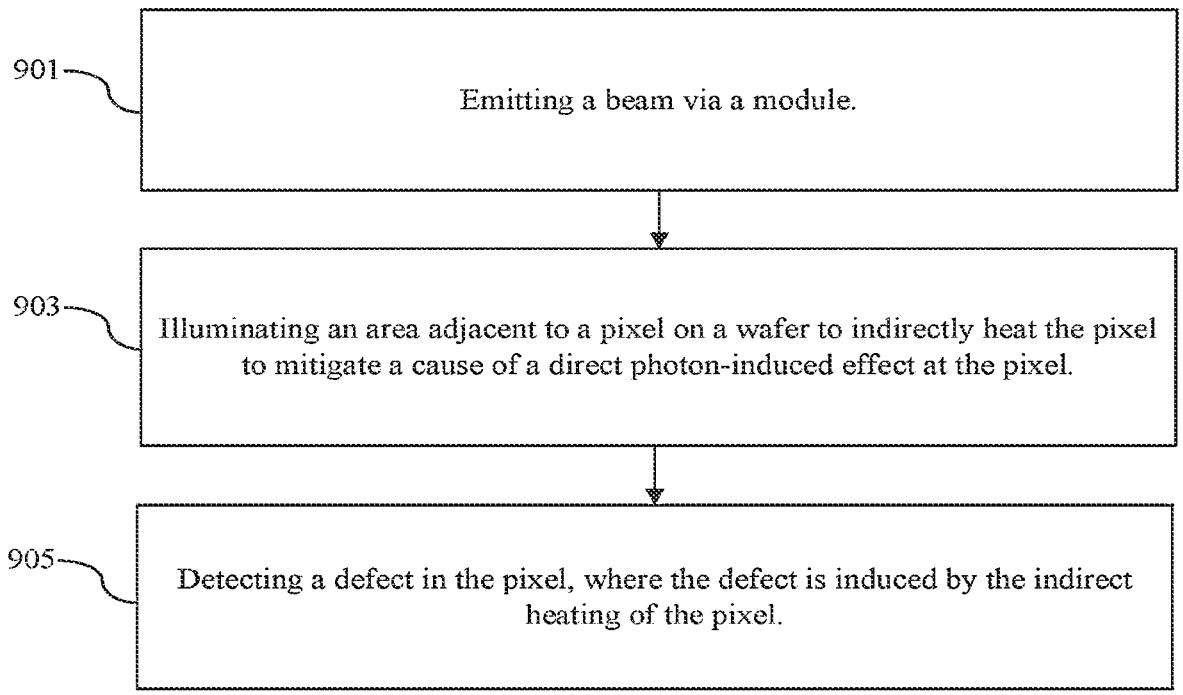
FIG. 9 is a flowchart illustrating an exemplary process of inspecting a sample using an ACC module, consistent with embodiments of the present disclosure.

Reference is now made to FIG. 9, a flowchart illustrating an exemplary process 900 of inspecting a sample using an ACC module, consistent with embodiments of the present disclosure.

At step 901, a module (e.g., ACC module 320 of FIG. 3, ACC modules 720A, 722A, 724A, or 726A of FIG. 7A, ACC module 720B of FIG. 7B, or ACC module configuration 800A of FIG. 8A) comprising a laser source may emit a beam (e.g., light beam 322 of FIG. 3, light beams 750A, 752A, 754A, or 756A of FIG. 7A, light beam 752B of FIG. 7B, or light beam 822 of FIG. 8A or 8B). The ACC module may include one or more ACC beam sources that each emit one or more light beams onto a wafer during inspection. In some embodiments, the electron beam system may include one ACC module that includes one or a plurality of ACC beam sources. An electron beam tool (e.g., electron beam tool 104 of FIG. 2, electron beam tool 310 of FIG. 3, electron beam tool 710A of FIG. 7A, or electron beam tool 710B of FIG. 7B) may emit a primary electron beam (e.g., primary electron beam 202 of FIG. 2, primary electron beam 312 of FIG. 3, primary electron beam 712A of FIG. 7A, or primary electron beam 712B of FIG. 7B) onto an area of interest on wafer (e.g., sample 208 of FIG. 2, wafer 340 of FIG. 3, wafer 740A of FIG. 7A, or wafer 740B of FIG. 7B), and collect secondary electrons (e.g., secondary electron beams 261, 262, or 263 of FIG. 2) emanated from the wafer surface to form an image of the area of interest on wafer 740A.

In some embodiments, the electron beam system may include beam splitters (e.g., beam splitters 762B of FIG. 7B) and mirrors (e.g., mirrors 772B of FIG. 7B). In some embodiments, the beam splitters may each be configured to split an emitted beam while each of the mirrors may be configured to reflect a light beam. For example, the beam splitters may be configured to split the light beam into a plurality of light beams while the mirrors may be configured to reflect the plurality of light beams such a plurality of light beams may be directed onto the wafer during inspection.

In some embodiments, an ACC module configuration (e.g., ACC module configuration 800A of FIG. 8A or 8B) may include an ACC beam source (e.g., ACC beam source 824 of FIG. 8A or 8B) and parabolic mirrors (e.g., parabolic mirrors 872 and 874 of FIG. 8A or 8B). The ACC beam source may emit a plurality of light beams (e.g., plurality of light beams 822 of FIG. 8A or 8B). A first parabolic mirror may be configured to reflect each light beam to a second parabolic mirror. The second parabolic mirror may be configured to receive each light beam and reflect each light beam to an area adjacent to a pixel (e.g., pixel 880 of FIG. 8A or 8B) on a wafer (e.g., sample 208 of FIG. 2 or wafer 340 of FIG. 3). The ACC module configuration may include any number of ACC beam sources or parabolic mirrors. In some embodiments, the area may include a plurality of areas or the pixel may include a plurality of pixels.

In some embodiments, the ACC module configuration may include a beam spot (e.g., beam spot 842 of FIG. 8B) emitted from one or more ACC beam sources and the beam spot may be a ring shape formed by the emitted light beams. In some embodiments, the beam spot may surround a pixel (e.g., pixel 880 of FIG. 8B). In some embodiments, the pixel may include a plurality of pixels. In some embodiments, a special designed sample surface may be used to collect the one or more light beam signals emitted from the ACC beam sources. In yet other embodiments, the wafer surface or a smooth surface may also be used to collect the one or more light beam signals emitted from the ACC beam sources.

At step 903, the light beam may illuminate an area adjacent to a pixel on a wafer and indirectly heat the pixel to reduce causes of a direct photon-induced effect at the pixel.

In some embodiments, beam spots (e.g., beam spot 342 of FIG. 3, area of interest 742A of FIG. 7A, area of interest 742B of FIG. 7B, beam spots 742C of FIG. 7C, or beam spot 842 of FIG. 8A or 8B) emitted from one or more ACC modules may illuminate an area adjacent to the pixel (e.g., pixel 780C of FIG. 7C or pixel 880 of FIG. 8A or 8B) on a wafer. In some embodiments, the area may include a plurality of areas or the pixel may include a plurality of pixels. The beam spots may indirectly heat the pixel such that the beam spots do not cause light-induced carrier density changes at the pixel. For example, thermal energy (e.g., thermal energy 790C of FIG. 7C or thermal energy 890 of FIG. 8B) may be diffused from each beam spot into the pixel without directly exposing the pixel to any photons from the beam spots, thereby mitigating any sources or causes of direct photon-induced effects at the pixel. In some embodiments, mitigating a cause of a direct photon-induced effect at a pixel may include generating substantially zero photon-induced charges at the pixel or generating substantially zero photon-induced carrier density changes at the pixel since the beam spot may only illuminate an area adjacent to the pixel rather than illuminate the pixel. In some embodiments, mitigating a cause of a direct photon-induced effect at the pixel may include minimizing or reducing an impact of a cause of a direct photon-induced effect at the pixel. In some embodiments, one or more separate laser sources (e.g., from one or more ACC modules) may be configured to tune a plurality of surface charges on the wafer in order to control accumulated charges on the wafer during inspection.

In some embodiments, the ACC beam source may be a laser (e.g., an infrared laser, a visible laser, an ultraviolet laser, a multi-laser configuration, etc.). For example, the ACC beam source may include a laser with a wavelength less than the energy bandgap of the target material in order to generate heat in the material. When the laser has a wavelength that is less than the energy bandgap of the target material, the photons of the laser have more energy than the energy bandgap, thereby resulting in the photos exciting the electrons in the target material such that heat is generated in the target material.

In some embodiments, when the ACC beam source includes a laser (e.g., an infrared laser) with a wavelength less than the energy bandgap of the target material, the ACC beam source may emit a beam spot directly onto a pixel, thereby generating heat in the material while mitigating any sources or causes of direct photon-induced defects, light-induced carrier density changes, or photoelectric effects at the pixel.

At step 905, an electron beam tool may detect a defect in the pixel, wherein the defect is induced by the indirect heating of the pixel.

In some embodiments, thermal diffusion caused by the beam spots may cause the pixel to reach temperatures of operating devices that include the pixel (e.g., 40-100° C.), thereby advantageously simulating operating conditions of the wafer. In some embodiments, the thermal diffusion may induce a defect in the pixel. In some embodiments, the defect may include a plurality of defects. In some embodiments, the electron beam systems may be configured to detect the one or more defects in the pixel using voltage contrast. Since the pixel is not directly exposed to the beam spots, photon-induced defects may be distinguishable from thermally-induced defects using voltage contrast during inspection. For example, variations in the effective resistance and voltage of a material due to photon-induced changes in the generation of free electrons may be distinguished from thermally-induced changes in the generation of free electrons.

A non-transitory computer readable medium may be provided that stores instructions for a processor of a controller (e.g., controller 109 of FIG. 1) for controlling the ACC module, consistent with embodiments in the present disclosure, based on the beam profile and beam power of the light beam. For example, based on the beam power of light beam, the controller may automatically adjust a working current of the ACC beam source included in the ACC module to keep an output power of the ACC beam source at a target power or to remain stable. Moreover, based on the beam power of the light beam, the controller may be configured to monitor a location of the beam spot formed by the light beam on the wafer surface. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

The embodiments may further be described using the following clauses:

1. An electron beam system, the system comprising:
   a module configured to emit a beam that illuminates an area adjacent to a pixel on a wafer to indirectly heat the pixel to mitigate a cause of a direct photon-induced effect at the pixel; and
   an electron beam tool configured to detect a defect in the pixel, wherein the defect is induced by the indirect heating of the pixel.
2. The system of clause 1, wherein the electron beam tool is further configured to detect the defect using voltage contrast.
3. The system of any one of clauses 1-2, wherein the module comprises a laser source.
4. The system of clause 3, wherein:
   the beam comprises a plurality of beams,
   the laser source comprises a plurality of laser sources, and
   each laser source of the plurality of laser sources is configured to emit a beam of the plurality of beams.
5. The system of clause 4, wherein the area comprises a plurality of areas and each beam of the plurality of beams illuminates each area of the plurality of areas adjacent to the pixel on the wafer.
6. The system of clause 5, wherein each beam of the plurality of beams indirectly heats the pixel.
7. The system of any one of clauses 1-2, wherein the module further comprises a beam splitter and a mirror.
8. The system of clause 7, wherein the beam splitter is configured to split the beam into a plurality of beams.
9. The system of clause 8, wherein the area comprises a plurality of areas and the mirror is configured to reflect each beam of the plurality of beams to each area of the plurality of areas.
10. The system of clause 9, wherein each beam of the plurality of beams illuminates each area of the plurality of areas adjacent to the pixel on the wafer.
11. The system of clause 10, wherein each beam of the plurality of beams indirectly heats the pixel.
12. The system of clause 11, wherein the beam splitter comprises a plurality of beam splitters.
13. The system of any one of clauses 11-12, wherein the mirror comprises a plurality of mirrors.
14. The system of any one of clauses 1-2, wherein the beam comprises a plurality of beams.
15. The system of clause 14, wherein the module further comprises a first parabolic mirror and a second parabolic mirror.
16. The system of clause 15, wherein the first parabolic mirror is configured to reflect each beam of the plurality of beams to the second parabolic mirror.
17. The system of clause 16, wherein:
   the area comprises a plurality of areas,
   the second parabolic mirror is configured to receive each beam of the plurality of beams, and
   the second parabolic mirror is configured to reflect each beam of the plurality of beams to each area of the plurality of areas adjacent to the pixel on the wafer.
18. The system of clause 17, wherein each beam of the plurality of beams indirectly heats the pixel.
19. The system of clause 18, wherein the plurality of beams form a ring shape surrounding the pixel.
20. The system of any one of clauses 1-19, wherein the pixel comprises a plurality of pixels.
21. The system of any one of clauses 1-20, wherein the defect comprises a plurality of defects.
22. The system of any one of clauses 3-21, wherein the laser source comprises one of an infrared laser, a visible laser, or an ultraviolet laser.
23. The system of any one of clauses 3 or 22, wherein:
   the laser source comprises a plurality of laser sources, and
   at least one laser source of the plurality of laser sources is configured to tune a plurality of surface charges on the wafer.
24. The system of any one of clauses 1-23, wherein the indirect heating causes a temperature of the pixel to reach an operating temperature of the pixel.
25. The system of any one of clauses 1-24, wherein the pixel comprises a P-N junction.

26. The system of any one of clauses 1-24, wherein the pixel comprises bulk material.
27. A method for inspection, comprising:
    emitting, from a module, a beam that illuminates an area adjacent to a pixel on a wafer to indirectly heat the pixel to mitigate a cause of a direct photon-induced effect at the pixel; and
    detecting a defect in the pixel, wherein the defect is induced by the indirect heating of the pixel.
28. The method of clause 27, further comprising detecting the defect using voltage contrast.
29. The method of any one of clauses 27-28, wherein the module comprises a laser source.
30. The method of clause 29, wherein the beam comprises a plurality of beams and the laser source comprises a plurality of laser sources, further comprising:
    emitting a beam of the plurality of beams from each laser source of the plurality of laser sources.
31. The method of clause 30, wherein the area comprises a plurality of areas and each beam of the plurality of beams illuminates each area of the plurality of areas adjacent to the pixel on the wafer.
32. The method of clause 31, wherein each beam of the plurality of beams indirectly heats the pixel.
33. The method of any one of clauses 27-28, wherein the module further comprises a beam splitter and a mirror.
34. The method of clause 33, wherein the beam splitter is configured to split the beam into a plurality of beams.
35. The method of clause 34, wherein the area comprises a plurality of areas and the mirror is configured to reflect each beam of the plurality of beams to each area of the plurality of areas.
36. The method of clause 35, wherein each beam of the plurality of beams illuminates each area of the plurality of areas adjacent to the pixel on the wafer.
37. The method of clause 36, wherein each beam of the plurality of beams indirectly heats the pixel.
38. The method of clause 37, wherein the beam splitter comprises a plurality of beam splitters.
39. The method of any one of clauses 37-38, wherein the mirror comprises a plurality of mirrors.
40. The method of any one of clauses 27-28, wherein the beam comprises a plurality of beams.
41. The method of clause 40, wherein the module further comprises a first parabolic mirror and a second parabolic mirror.
42. The method of clause 41, wherein the first parabolic mirror is configured to reflect each beam of the plurality of beams to the second parabolic mirror.
43. The method of clause 42, wherein:
    the area comprises a plurality of areas,
    the second parabolic mirror is configured to receive each beam of the plurality of beams, and
    the second parabolic mirror is configured to reflect each beam of the plurality of beams to each area of the plurality of areas adjacent to the pixel on the wafer.
44. The method of clause 43, wherein each beam of the plurality of beams indirectly heats the pixel.
45. The method of clause 44, wherein the plurality of beams form a ring shape surrounding the pixel.
46. The method of any one of clauses 27-45, wherein the pixel comprises a plurality of pixels.
47. The method of any one of clauses 27-46, wherein the defect comprises a plurality of defects.
48. The method of any one of clauses 29-47, wherein the laser source comprises one of an infrared laser, a visible laser, or an ultraviolet laser.
49. The method of any one of clauses 29 or 48, wherein:
    the laser source comprises a plurality of laser sources, and
    at least one laser source of the plurality of laser sources is configured to tune a plurality of surface charges on the wafer.
50. The method of any one of clauses 27-49, wherein the indirect heating causes a temperature of the pixel to reach an operating temperature of the pixel.
51. The method of any one of clauses 27-50, wherein the pixel comprises a P-N junction.
52. The method of any one of clauses 27-50, wherein the pixel comprises bulk material.
53. A non-transitory computer readable medium that stores a set of instructions that is executable by at least one processor of a computing device to cause the computing device to perform a method for inspection, the method comprising:
    emitting, from a module, a beam that illuminates an area adjacent to a pixel on a wafer to indirectly heat the pixel to mitigate a cause of a direct photon-induced effect at the pixel; and
    detecting a defect in the pixel, wherein the defect is induced by the indirect heating of the pixel.
54. The non-transitory computer readable medium of clause 53, wherein the set of instructions that is executable by the at least one processor of the computing device to cause the computing device to further perform:
    detecting the defect using voltage contrast.
55. The non-transitory computer readable medium of any one of clauses 53-54, wherein the module comprises a laser source.
56. The non-transitory computer readable medium of clause 55, wherein the beam comprises a plurality of beams and the laser source comprises a plurality of laser sources, wherein the set of instructions that is executable by the at least one processor of the computing device to cause the computing device to further perform:
    emitting a beam of the plurality of beams from each laser source of the plurality of laser sources.
57. The non-transitory computer readable medium of clause 56, wherein the area comprises a plurality of areas and each beam of the plurality of beams illuminates each area of the plurality of areas adjacent to the pixel on the wafer.
58. The non-transitory computer readable medium of clause 57, wherein each beam of the plurality of beams indirectly heats the pixel.
59. The non-transitory computer readable medium of any one of clauses 53-54, wherein the module further comprises a beam splitter and a mirror.
60. The non-transitory computer readable medium of clause 59, wherein the beam splitter is configured to split the beam into a plurality of beams.
61. The non-transitory computer readable medium of clause 60, wherein the area comprises a plurality of areas and the mirror is configured to reflect each beam of the plurality of beams to each area of the plurality of areas.
62. The non-transitory computer readable medium of clause 61, wherein each beam of the plurality of beams illuminates each area of the plurality of areas adjacent to the pixel on the wafer.

63. The non-transitory computer readable medium of clause 62, wherein each beam of the plurality of beams indirectly heats the pixel.

64. The non-transitory computer readable medium of clause 63, wherein the beam splitter comprises a plurality of beam splitters.

65. The non-transitory computer readable medium of any one of clauses 63-64, wherein the mirror comprises a plurality of mirrors.

66. The non-transitory computer readable medium of any one of clauses 53-54, wherein the beam comprises a plurality of beams.

67. The non-transitory computer readable medium of clause 66, wherein the module further comprises a first parabolic mirror and a second parabolic mirror.

68. The non-transitory computer readable medium of clause 67, wherein the first parabolic mirror is configured to reflect each beam of the plurality of beams to the second parabolic mirror.

69. The non-transitory computer readable medium of clause 68, wherein:
the area comprises a plurality of areas,
the second parabolic mirror is configured to receive each beam of the plurality of beams, and
the second parabolic mirror is configured to reflect each beam of the plurality of beams to each area of the plurality of areas adjacent to the pixel on the wafer.

70. The non-transitory computer readable medium of clause 69, wherein each beam of the plurality of beams indirectly heats the pixel.

71. The non-transitory computer readable medium of clause 70, wherein the plurality of beams form a ring shape surrounding the pixel.

72. The non-transitory computer readable medium of any one of clauses 53-71, wherein the pixel comprises a plurality of pixels.

73. The non-transitory computer readable medium of any one of clauses 53-72, wherein the defect comprises a plurality of defects.

74. The non-transitory computer readable medium of any one of clauses 55-73, wherein the laser source comprises one of an infrared laser, a visible laser, or an ultraviolet laser.

75. The non-transitory computer readable medium of any one of clauses 55 or 74, wherein:
the laser source comprises a plurality of laser sources, and
at least one laser source of the plurality of laser sources is configured to tune a plurality of surface charges on the wafer.

76. The non-transitory computer readable medium of any one of clauses 53-75, wherein the indirect heating causes a temperature of the pixel to reach an operating temperature of the pixel.

77. The non-transitory computer readable medium of any one of clauses 53-76, wherein the pixel comprises a P-N junction.

78. The non-transitory computer readable medium of any one of clauses 53-76, wherein the pixel comprises bulk material.

79. An electron beam system, the system comprising:
a module configured to emit a beam that illuminates a pixel on a wafer to heat the pixel to mitigate a cause of a direct photon-induced effect at the pixel; and
an electron beam tool configured to detect a defect in the pixel, wherein the defect is induced by the heating of the pixel.

80. The system of clause 79, wherein the module comprises an infrared laser.

81. The system of any one of clauses 1-26, wherein the module comprises an advanced charge controller (ACC) module.

82. The system of any one of clauses 1-26 or 81, wherein the cause comprises a plurality of causes.

83. The system of any one of clauses 1-26 or 81-82, wherein mitigating the cause of a direct photon-induced effect at the pixel comprises generating substantially zero photon-induced charges at the pixel or generating substantially zero photon-induced carrier density changes at the pixel.

84. The method of any one of clauses 27-52, wherein the module comprises an advanced charge controller (ACC) module.

85. The method of any one of clauses 27-52 or 84, wherein the cause comprises a plurality of causes.

86. The method of any one of clauses 27-52 or 84-85, wherein mitigating the cause of a direct photon-induced effect at the pixel comprises generating substantially zero photon-induced charges at the pixel or generating substantially zero photon-induced carrier density changes at the pixel.

87. The non-transitory computer readable medium of any one of clauses 53-78, wherein the module comprises an advanced charge controller (ACC) module.

88. The non-transitory computer readable medium of any one of clauses 53-78 or 87, wherein the cause comprises a plurality of causes.

89. The non-transitory computer readable medium of any one of clauses 53-78 or 87-88, wherein mitigating the cause of a direct photon-induced effect at the pixel comprises generating substantially zero photon-induced charges at the pixel or generating substantially zero photon-induced carrier density changes at the pixel.

90. The system of any one of clauses 79-80, wherein the module comprises an advanced charge controller (ACC) module.

91. The system of any one of clauses 79-80 or 90, wherein the cause comprises a plurality of causes.

92. The system of any one of clauses 79-80 or 90-91, wherein mitigating the cause of a direct photon-induced effect at the pixel comprises generating substantially zero photon-induced charges at the pixel or generating substantially zero photon-induced carrier density changes at the pixel.

It will be appreciated that the embodiments of the present disclosure are not limited to the exact construction that has been described above and illustrated in the accompanying drawings, and that various modifications and changes may be made without departing from the scope thereof.

The invention claimed is:

1. A non-transitory computer readable medium that stores a set of instructions that is executable by at least one processor of a computing device to cause the computing device to perform a method for inspection, the method comprising:
emitting, from a module, a beam that illuminates an area adjacent to a pixel on a wafer to indirectly heat the pixel to mitigate a cause of a direct photon-induced effect at the pixel; and
detecting a defect in the pixel, wherein the defect is induced by the indirect heating of the pixel.

2. The non-transitory computer readable medium of claim 1, wherein the set of instructions that is executable by the at least one processor of the computing device to cause the computing device to further perform:
  detecting the defect using voltage contrast.

3. The non-transitory computer readable medium of claim 1, wherein the module comprises a laser source.

4. The non-transitory computer readable medium of claim 3, wherein the beam comprises a plurality of beams and the laser source comprises a plurality of laser sources, wherein the set of instructions that is executable by the at least one processor of the computing device to cause the computing device to further perform:
  emitting a beam of the plurality of beams from each laser source of the plurality of laser sources.

5. The non-transitory computer readable medium of claim 4, wherein the area comprises a plurality of areas and each beam of the plurality of beams illuminates each area of the plurality of areas adjacent to the pixel on the wafer.

6. The non-transitory computer readable medium of claim 5, wherein each beam of the plurality of beams indirectly heats the pixel.

7. The non-transitory computer readable medium of claim 1, wherein the module further comprises a beam splitter and a mirror.

8. The non-transitory computer readable medium of claim 1, wherein the beam comprises a plurality of beams.

9. The non-transitory computer readable medium of claim 8, wherein the module further comprises a first parabolic mirror and a second parabolic mirror.

10. The non-transitory computer readable medium of claim 9, wherein the first parabolic mirror is configured to reflect each beam of the plurality of beams to the second parabolic mirror.

11. The non-transitory computer readable medium of claim 10, wherein:
  the area comprises a plurality of areas,
  the second parabolic mirror is configured to receive each beam of the plurality of beams, and
  the second parabolic mirror is configured to reflect each beam of the plurality of beams to each area of the plurality of areas adjacent to the pixel on the wafer.

12. The non-transitory computer readable medium of claim 11, wherein each beam of the plurality of beams indirectly heats the pixel.

13. The non-transitory computer readable medium of claim 12, wherein the plurality of beams form a ring shape surrounding the pixel.

14. The non-transitory computer readable medium of claim 3, wherein:
  the laser source comprises a plurality of laser sources, and
  at least one laser source of the plurality of laser sources is configured to tune a plurality of surface charges on the wafer.

15. The non-transitory computer readable medium of claim 1, wherein the indirect heating causes a temperature of the pixel to reach an operating temperature of the pixel.

16. The non-transitory computer readable medium of claim 1, wherein the module comprises an advanced charge controller (ACC) module.

17. The non-transitory computer readable medium of claim 1, wherein mitigating the cause of a direct photon-induced effect at the pixel comprises generating substantially zero photon-induced charges at the pixel or generating substantially zero photon-induced carrier density changes at the pixel.

18. An electron beam system, the system comprising:
  a module configured to emit a beam that illuminates a pixel on a wafer to heat the pixel to mitigate a cause of a direct photon-induced effect at the pixel; and
  an electron beam tool configured to detect a defect in the pixel, wherein the defect is induced by the heating of the pixel.

19. The system of claim 18, wherein the module comprises an infrared laser.

20. The system of claim 18, wherein mitigating the cause of a direct photon-induced effect at the pixel comprises generating substantially zero photon-induced charges at the pixel or generating substantially zero photon-induced carrier density changes at the pixel.

* * * * *